(12) United States Patent
Poulin

(10) Patent No.: US 12,320,835 B2
(45) Date of Patent: Jun. 3, 2025

(54) DEVICE FOR DETECTING BREAKAGE OF AN ELECTRICAL CABLE AND ASSOCIATED OPERATING METHOD

(71) Applicant: NEXANS, Courbevoie (FR)

(72) Inventor: Nicolas Poulin, Auchy les Mines (FR)

(73) Assignee: NEXANS, Courbevoie (FR)

( * ) Notice: Subject to any disclaimer, the term of this patent is extended or adjusted under 35 U.S.C. 154(b) by 199 days.

(21) Appl. No.: 17/986,717

(22) Filed: Nov. 14, 2022

(65) Prior Publication Data

US 2023/0160940 A1     May 25, 2023

(30) Foreign Application Priority Data

Nov. 25, 2021   (FR) ..................................... 2112535

(51) Int. Cl.
   *G01R 31/08*     (2020.01)
   *G01R 1/07*      (2006.01)
   *G01R 19/00*     (2006.01)
   *G01R 31/58*     (2020.01)

(52) U.S. Cl.
   CPC ............. *G01R 31/085* (2013.01); *G01R 1/07* (2013.01); *G01R 19/0084* (2013.01); *G01R 31/58* (2020.01)

(58) Field of Classification Search
   CPC .... G01R 31/085; G01R 1/07; G01R 19/0084; G01R 31/58; G01R 31/54; G08B 13/1418
   See application file for complete search history.

(56) References Cited

U.S. PATENT DOCUMENTS

| | | |
|---|---|---|
| 2005/0182398 A1 | 8/2005 | Paterson |
| 2007/0279068 A1 | 12/2007 | Harres |
| 2011/0273302 A1 | 11/2011 | Fornage et al. |
| 2014/0267712 A1* | 9/2014 | Foerster ........... G08B 13/19695 340/568.3 |
| 2014/0347070 A1* | 11/2014 | Scheuschner .......... G01R 31/08 324/543 |
| 2015/0240459 A1* | 8/2015 | Kawasaki ............... E02F 9/267 701/50 |
| 2021/0344184 A1* | 11/2021 | Gundel .................. G01R 31/58 |

FOREIGN PATENT DOCUMENTS

| | | |
|---|---|---|
| CN | 111 693 819 | 9/2020 |
| EP | 2 019 323 | 1/2009 |
| JP | H02 10169 | 1/1990 |

OTHER PUBLICATIONS

International Search Report dated Jul. 15, 2022.

* cited by examiner

*Primary Examiner* — Akm Zakaria
(74) *Attorney, Agent, or Firm* — MUNCY, GEISSLER, OLDS & LOWE, P.C.

(57) ABSTRACT

A device (10) for detecting breakage of at least one electrical cable (12) has the at least one electrical cable (12), a wireless sensor (14) connected to the at least one electrical cable (12), and at least one power supply unit (18) supplying power to the wireless sensor (14). The at least one power supply unit (18) has a means (20) of applying a predetermined potential to the at least one electrical cable (12), and the wireless sensor (14) is designed to detect either the predetermined potential, which is an indicator of the integrity of the at least one electrical cable (12), or a floating potential, which is an indicator of the breakage of the at least one electrical cable (12).

10 Claims, 2 Drawing Sheets

DEVICE FOR DETECTING BREAKAGE OF AN ELECTRICAL CABLE AND ASSOCIATED OPERATING METHOD

RELATED APPLICATION

This application claims the benefit of priority from French Patent Application No. 21 12535, filed on Nov. 25, 2021, the entirety of which is incorporated by reference.

FIELD OF THE INVENTION

The present invention relates to an electrical cable anti-theft device and to an associated operating method.

The invention belongs to the field of electrical cables and devices for protecting against theft or other unexpected breakage of such cables.

BACKGROUND

Specifically, sometimes before they are energized, cables or segments of cables are subject to theft or other malicious acts causing them to break, for example when they are stored in trenches, on the ground or at low height, waiting to be installed.

These malicious breakages of the cables may also occur after the cables have been installed but before they are energized, in particular if the cables are not buried and are located at easily accessible heights.

In order to allow an intervention sufficiently early to stop the cables being stolen, there exist cable anti-theft devices.

A device for detecting theft of a lighting cable is known, for example, from document ES-U-1 198 360. A breakage in the cabling of the electrical grid which supplies power to the lighting installation comprising this lighting cable, due to attempted theft of this lighting cable, is detected either during the day, in the absence of lighting, via the detection of the electrical resistance of the cable line concerned, or during the night, via the detection of the electrical intensity of the current passing through the cable. A warning message is then sent in the form of an SMS to a given mobile terminal.

Such a device has various limitations. First of all, the monitored cable needs to be energized in order for this anti-theft device, based on the detection of an electrical resistance or of an electrical intensity, to operate. Furthermore, its principle of operation is linked to the nature of the monitored cables, which are lighting cables. It therefore does not apply to all types of cable.

Objects and Summary

The object of the present invention is to remedy the aforementioned drawbacks of the prior art.

To this end, the present invention proposes a device for detecting breakage of at least one electrical cable, this device comprising:
the at least one electrical cable,
a wireless sensor connected to the at least one electrical cable,
at least one power supply unit supplying power to the wireless sensor, the device being noteworthy in that:
the at least one power supply unit comprises a means of applying a predetermined potential to the at least one electrical cable; and
the wireless sensor is designed to detect either the predetermined potential, which is an indicator of the integrity of the at least one electrical cable, or a floating potential, which is an indicator of the breakage of the at least one electrical cable.

Thus, the breakage of the cable causes the loss of the predetermined potential which was applied to it and the appearance of a floating potential, detected immediately and simply by the wireless sensor. This makes it possible to limit repairs and installation delays in the event that the severed cable was not yet installed, or even production stoppages for users if the cable was already in operation.

Moreover, this device is particularly suited to the case of a large number of cables to monitor, in the knowledge that no cabling is required for the installation of a wireless sensor per electrical cable to monitor. This allows tidy and easy installation, in contrast to monitoring devices comprising wire elements that need to be connected.

In one particular embodiment, the device further comprises a radiofrequency signal transmitting unit designed to transmit signals which differ depending on whether the detected potential is the predetermined potential or the floating potential.

This allows the device to transmit a signal that warns of the effected detection. Thus, upon receiving the warning, any appropriate intervention measure may be taken by the personnel responsible for the electrical cable in question.

In this embodiment, the device may further comprise a communication module connected to the wireless sensor and to the radiofrequency signal transmitting unit.

Such a communication module is optional. It may be provided as an alternative to a direct data exchange mode between the wireless sensor and the radiofrequency signal transmitting unit.

In one particular embodiment in which the device comprises the aforementioned radiofrequency signal transmitting unit, this transmitting unit may be an integral part of the wireless sensor. This makes the device more compact, with fewer components.

In one particular embodiment in which the device comprises the aforementioned radiofrequency signal transmitting unit, this radiofrequency signal transmitting unit may comprise at least one antenna. This makes it possible to transmit the signals through the air to a wired or wireless communication network, for example for the transmission of the warning following the detection of breakage of the electrical cable.

In one particular embodiment, the device further comprises an energy storage unit supplying energy to the power supply unit.

This allows the device to be self-sufficient in terms of energy and to be able to operate even in the absence of a mains power supply in the area where the electrical cable is situated.

In this embodiment, according to one particular feature which is optional but not necessary, the device may further comprise a power matching unit connected to the energy storage unit and to the power supply unit and supplying to the power supply unit a power that is matched to the power received from the energy storage unit.

This stage of power matching allows compatibility between different types of energy storage units and different types of power supply units.

With the same object as that indicated above, the present invention also proposes a method for detecting breakage of at least one electrical cable, this method being noteworthy in that it comprises steps of:
applying a predetermined potential to the at least one electrical cable;

detecting, by way of a wireless sensor connected to the at least one electrical cable, either the predetermined potential, which is an indicator of the integrity of the at least one electrical cable, or a floating potential, which is an indicator of the breakage of the at least one electrical cable.

In one particular embodiment, the method further comprises a step of sending a warning signal in the event that the aforementioned floating potential is detected.

In this embodiment, according to one particular feature which is possible but not necessary, the step of sending the warning signal may comprise a message being sent to a mobile telecommunications terminal, by way of a telecommunications network.

Since the particular features and the advantages of the method are similar to those of the device, they are not repeated here.

BRIEF DESCRIPTION OF THE DRAWINGS

Other aspects and advantages of the invention will become apparent on reading the detailed description below of particular embodiments, which are given by way of entirely non-limiting examples, with reference to the appended drawings, in which.

DETAILED DESCRIPTION OF EMBODIMENT(S)

Figure 1:
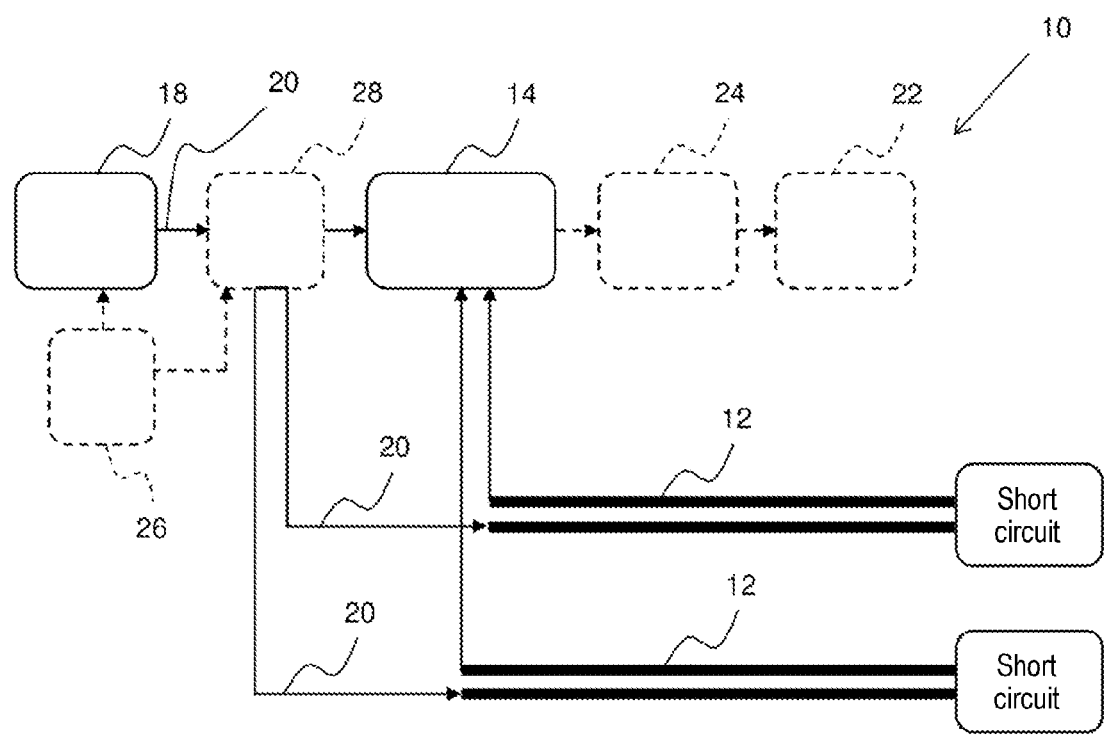
FIG. 1 is a schematic representation of a device for detecting breakage of an electrical cable in accordance with the present invention, in one particular embodiment in which the device comprises two electrical cables.

FIG. 1 shows a schematic view of a device 10 for detecting breakage of an electrical cable in accordance with the present invention, in one particular embodiment in which the device 10 comprises two electrical cables 12 to monitor. This particular number of electrical cables 12 is only one example amongst others, any number of cables being possible.

The electrical cable 12 considered may for example be an electrical power cable, intended for example to transport energy and/or to transmit data, such as for example a signal cable.

By way of a non-limiting example, it may be a cable of several kilometres in length, intended to be buried in a trench, between two stations or sub-stations of an energy supply infrastructure.

In addition to this or these cables 12, the device 10 comprises one or more wireless sensors 14.

The wireless sensors 14 are for example equipped with Bluetooth technology (registered trade mark) or equivalent.

Each wireless sensor 14 is connected to an electrical cable 12.

The device 10 furthermore comprises one or more power supply units 18 supplying power to the one or more wireless sensors 14.

In the particular embodiment of FIG. 1, the device 10 comprises one power supply unit 18 supplying power to the wireless sensor 14. Alternatively, a plurality of power supply units 18 may supply power to one and the same wireless sensor 14.

In accordance with the present invention, the power supply unit 18 comprises a means 20 of applying a predetermined potential to the electrical cable 12, and the wireless sensor 14 is designed to detect either this predetermined potential or a floating potential.

Specifically, as shown in FIG. 1, the device 10 is connected, via its power supply unit 18 and its wireless sensor 14, to two conductors of each cable 12 and a short circuit is established at the other end of the cable 12.

The predetermined potential, that is to say a predetermined potential value detected by the means 20 across the terminals of the monitored cable 12, indicates that the electrical cable 12 to which the wireless sensor 14 is connected is whole, in other words undamaged and notably not severed in order to be stolen.

In contrast, the floating potential, that is to say an indeterminate potential value detected by the means 20 across the terminals of the monitored cable 12, indicates that the electrical cable 12 to which the wireless sensor 14 is connected has been damaged, for example broken.

Thus, each wireless sensor 14 is designed to detect either a first predetermined potential, which is an indicator of the integrity of the electrical cable 12 to which it is connected, or a floating potential, which is an indicator of the breakage of this same electrical cable 12.

By way of an entirely non-limiting example, generally, the predetermined potential may be zero, that is to say that an electrical cable 12 monitored by the device 10 may be connected to earth.

Figure 2:
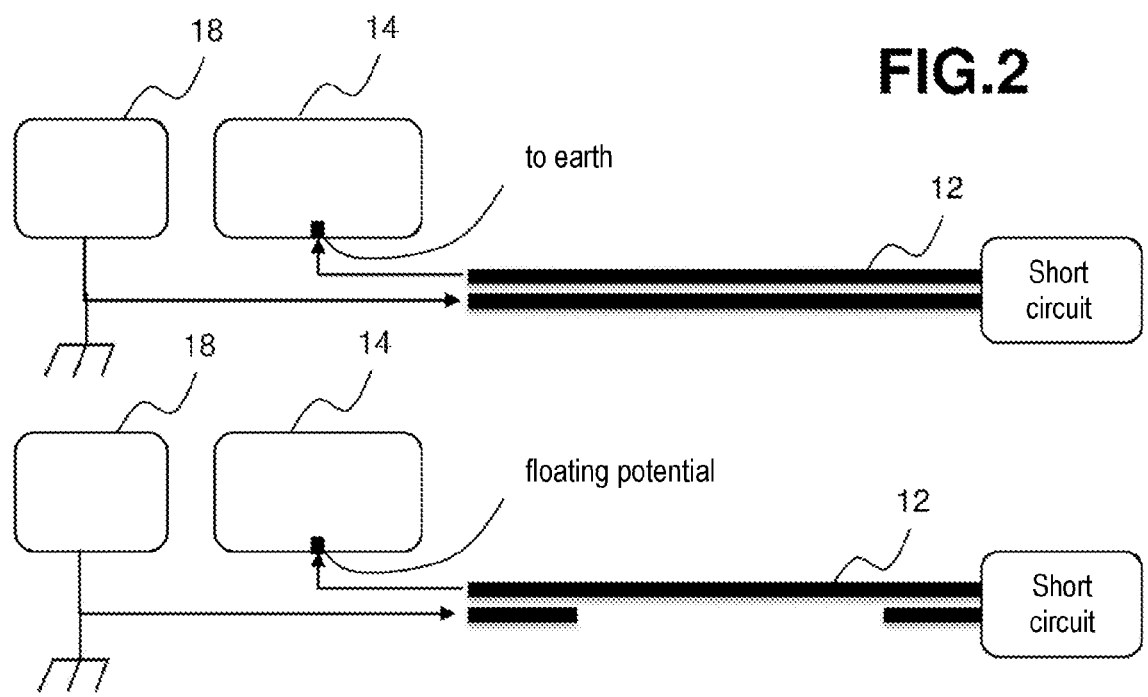
FIG. 2 is a comparative simplified schematic representation of a device in accordance with the present invention in a state in which the cable is whole and in a state in which the cable is severed, in one particular embodiment in which the device comprises a single electrical cable.

FIG. 2 illustrates an example of this type, in which the device 10 comprises a single electrical cable 12 which has a zero potential applied to it when it is whole (top diagram in the drawing) and has a floating potential in the case of breakage (bottom diagram in the drawing).

As is shown in FIG. 1, the device 10 may further comprise one or more optional elements 22, 24, 26 and 28, represented by dashes in the drawing and described below. It should be noted that in the embodiment of FIG. 2, the device 10 does not comprise any of these optional elements 22, 24, 26 and 28.

Thus, in one particular embodiment, the device 10 further comprises, optionally, a radiofrequency signal transmitting unit 22 designed to transmit signals which differ depending on whether the detected potential is the predetermined potential or the floating potential.

In this particular embodiment, the device 10 may additionally comprise, optionally, a communication module 24 connected to the wireless sensor 14 and to the radiofrequency signal transmitting unit 22.

Alternatively, the radiofrequency signal transmitting unit 22 may be integrated into the wireless sensor 14. For example, when the wireless sensors 14 are equipped with Bluetooth technology (registered trade mark), a Bluetooth (registered trade mark) gateway may be provided to communicate with all of the wireless sensors 14 and transmit radiofrequency signals through the air to a mobile telecommunications network, for example of the GSM (Global System for Mobile Communications) type. Thus, in the event that breakage of a monitored cable is detected, a warning signal may be sent via the gateway over the GSM network, for example via a text message, to a mobile terminal or to a database.

In one particular embodiment in which the device 10 comprises a radiofrequency signal transmitting unit 22, this radiofrequency signal transmitting unit 22 may comprise one or more antennas designed to transmit these radiofrequency signals through the air to the outside of the device 10.

As illustrated in FIG. 1, optionally, the device 10 may also comprise an energy storage unit 26. It may be for example a battery or cell or any other energy storage means, including of photovoltaic type.

The energy storage unit 26 supplies energy to the power supply unit 18, this allowing the device 10 to operate in the absence of any connection to the mains and of any other energy source near the location of the device 10 and in particular near the location of the one or more cables 12 to monitor.

As mentioned above, this is useful when, for example, a length of several kilometres of cable 12 is stored between two stations or sub-stations of an electrical energy supply infrastructure, before being installed and connected to these two stations or sub-stations.

In one particular embodiment in which the device 10 comprises such an energy storage unit 26, still optionally, the device 10 may further comprise a power matching unit 28.

As illustrated in FIG. 1, the power matching unit 28 is connected to the energy storage unit 26 and to the power supply unit 18 and supplies to the power supply unit 18 a power that is matched to the power received from the energy storage unit 26.

In this embodiment, the aforementioned means 20 of applying a predetermined potential to the electrical cable 12, comprised in the power supply unit 18, supplies this potential to the power matching unit 28, which applies it to the electrical cable 12 to monitor. When the device 10 comprises no power matching unit 28, the means 20 applies the potential directly to the electrical cable 12 to monitor. In FIG. 1, this is symbolized by arrows between the power supply unit 18, the power matching unit 28 and the electrical cables 12.

In one embodiment in which the device 10 comprises a radiofrequency signal transmitting unit 22, a tracking signal may be transmitted by the transmitting unit 22 in the form of a "good condition" message of the monitored electrical cable 12 to a chosen receiving element, such as a fixed or mobile telecommunications terminal, by way of a wired or wireless telecommunications network.

By way of an entirely non-limiting example, the network may be a network of GSM type or any other type of communication network.

By way of a non-limiting example, the transmission of such a tracking signal can be provided at a certain periodicity, for example once per day.

In one embodiment in which the transmitting unit 22 comprises an antenna, the tracking signal is transmitted by the antenna through the air.

Figure 3:
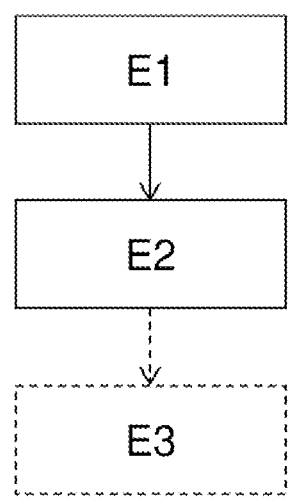
FIG. 3 is a flow diagram illustrating steps of a method for detecting breakage of an electrical cable in accordance with the present invention, in one particular embodiment.

The flow diagram of FIG. 3 illustrates steps of a method for detecting breakage of at least one electrical cable 12.

In accordance with the present invention, this method comprises a step E1 of applying the aforementioned predetermined potential to the electrical cable 12 and a subsequent step E2 of detecting, by way of the wireless sensor 14 connected to the electrical cable 12, either the predetermined potential, which is an indicator of the integrity of this electrical cable 12, or a floating potential, which is an indicator of the breakage of this same electrical cable 12.

Optionally, as illustrated by dashes in FIG. 3, the method may further comprise, after step E2, a step E3 of sending a warning signal in the event that the aforementioned floating potential is detected.

In one particular embodiment, step E3 of sending the warning signal may comprise a message being sent to a mobile telecommunications terminal, by way of a telecommunications network. By way of a non-limiting example, the message may be sent in the form of a text message. This sending therefore does not require access to the Internet in the course of the steps of the detection method in accordance with the invention. In contrast, optionally, from a warning message in the form of a text message, a website linked to the aforementioned telecommunications network may, from this text message, send an e-mail to a predefined address.

The present invention makes it possible to monitor the integrity of electrical cables remotely and in a way that is simple, effective, inexpensive, and economical in terms of energy and human resources, without it being necessary to modify the manufacturing process of these cables.

The invention claimed is:

1. A device for detecting breakage of at least two electrical cables, said device comprising:
   said at least two electrical cables, connected at a short,
   a wireless sensor connected to one of said at least two electrical cables,
   at least one power supply unit supplying power to another of said two electric cables, wherein:
   said at least one power supply unit comprises a means of applying a predetermined potential to said another of said at least two electrical cables, and detectable by said wireless sensor connected to said one of said at least two electric cables; and
   said wireless sensor is configured to be able to detect both said predetermined potential and a floating potential, where said predetermined potential is an indicator of integrity of said at least two electrical cables, and where said floating potential is an indicator of said breakage of at least one of said at least two electrical cables.

2. The device according to claim 1, wherein said device further comprises a radiofrequency signal transmitting unit designed to transmit signals which differ depending on whether the detected potential is said predetermined potential or said floating potential.

3. The device according to claim 2, wherein said device further comprises a communication module connected to said wireless sensor and to said radiofrequency signal transmitting unit.

4. The device according to claim 2, wherein said wireless sensor comprises said radiofrequency signal transmitting unit.

5. The device according to claim 2, wherein said radiofrequency signal transmitting unit comprises at least one antenna.

6. The device according to claim 1, wherein said device further comprises an energy storage unit supplying energy to said power supply unit.

7. The device according to claim 6, wherein said device further comprises a power matching unit connected to said energy storage unit and to said power supply unit and supplying to said power supply unit a power that is matched to the power received from said energy storage unit.

8. A method for detecting breakage of at least two electrical cables, said method comprising the steps of:
   connecting said at least two electrical cables in short at one end;
   applying a predetermined potential to one of said at least two electrical cables;
   detecting, by way of a wireless sensor connected to another of said at least two electrical cables, either said predetermined potential, which is an indicator of integrity of both of said at least two electrical cables, or a floating potential, which is an indicator of said breakage of one of said at least two electrical cables.

9. The method according to claim 8, wherein said method further comprises a step of sending a warning signal in the event that said floating potential is detected.

10. The method according to claim 9, wherein said step of sending said warning signal comprises a message being sent to a mobile telecommunications terminal, by way of a telecommunications network.

* * * * *